(12) United States Patent
Doris et al.

(10) Patent No.: US 9,570,590 B1
(45) Date of Patent: Feb. 14, 2017

(54) SELECTIVE OXIDATION OF BURIED SILICON-GERMANIUM TO FORM TENSILE STRAINED SILICON FINFETS

(71) Applicant: International Business Machines Corporation, Armonk, NY (US)

(72) Inventors: Bruce B. Doris, Slingerlands, NY (US); Alexander Reznicek, Troy, NY (US); Joshua M. Rubin, Albany, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/965,880

(22) Filed: Dec. 10, 2015

(51) Int. Cl.
| | |
|---|---|
| H01L 29/66 | (2006.01) |
| H01L 21/8238 | (2006.01) |
| H01L 29/78 | (2006.01) |
| H01L 29/06 | (2006.01) |
| H01L 29/10 | (2006.01) |
| H01L 21/308 | (2006.01) |
| H01L 21/3065 | (2006.01) |

(52) U.S. Cl.
CPC ..... *H01L 29/66795* (2013.01); *H01L 21/3065* (2013.01); *H01L 21/3085* (2013.01); *H01L 29/0649* (2013.01); *H01L 29/1054* (2013.01); *H01L 29/785* (2013.01); *H01L 29/7849* (2013.01)

(58) Field of Classification Search
CPC ............. H01L 21/3085; H01L 29/1054; H01L 29/0649; H01L 21/3065; H01L 21/823431; H01L 21/823821; H01L 21/845; H01L 27/0886; H01L 27/0924; H01L 27/10826; H01L 27/10879; H01L 27/1211; H01L 29/41791; H01L 29/66795–29/66818; H01L 29/785–29/7856; H01L 2924/13067
See application file for complete search history.

(56) References Cited

U.S. PATENT DOCUMENTS

| | | |
|---|---|---|
| 6,855,963 B1 | 2/2005 | Chu et al. |
| 7,045,401 B2 | 5/2006 | Lee et al. |
| 7,115,945 B2 | 10/2006 | Lee et al. |
| 8,183,627 B2 * | 5/2012 | Currie ............... H01L 21/82380 257/329 |
| 8,211,772 B2 | 7/2012 | Kavalieros et al. |
| 8,883,578 B2 | 11/2014 | Basker et al. |

(Continued)

*Primary Examiner* — Hoang-Quan Ho
(74) *Attorney, Agent, or Firm* — Daniel P. Morris, Esq.; Otterstedt, Ellenbogen & Kammer, LLP

(57) ABSTRACT

A method is provided for forming an integrated circuit with an n-region including n-type FinFETs and a p-region including p-type FinFETs. Initially, a silicon-germanium (SiGe) layer consisting essentially of silicon (Si) and germanium (Ge) is formed. The SiGe layer is recessed to form a recessed SiGe layer in the n-type region while leaving an intact SiGe layer in the p-region. A Si layer consisting essentially of Si is formed on the recessed SiGe layer. The Si layer and recessed SiGe layer are patterned to form a Si/SiGe fin comprising a Si fin portion disposed on a recessed SiGe fin portion. The intact SiGe layer in the p-region is patterned to form an intact SiGe fin. The recessed SiGe fin portion in the n-region is selectively oxidized utilizing an oxidation process having an oxidation rate in the recessed SiGe fin portion faster than an oxidation rate in the Si fin portion.

14 Claims, 5 Drawing Sheets

(56) References Cited

U.S. PATENT DOCUMENTS

| | | | |
|---|---|---|---|
| 8,951,870 B2 | 2/2015 | Basker et al. | |
| 8,975,168 B2 * | 3/2015 | Liu | H01L 21/02664 |
| | | | 438/149 |
| 9,368,411 B2 * | 6/2016 | Loubet | H01L 21/02664 |
| 2007/0069302 A1 * | 3/2007 | Jin | H01L 21/84 |
| | | | 257/369 |
| 2013/0285117 A1 | 10/2013 | Majumdar et al. | |
| 2013/0285118 A1 | 10/2013 | Majumdar et al. | |
| 2014/0197456 A1 * | 7/2014 | Wang | H01L 29/785 |
| | | | 257/192 |
| 2014/0357060 A1 * | 12/2014 | Liu | H01L 21/02664 |
| | | | 438/479 |
| 2015/0255581 A1 * | 9/2015 | Lin | H01L 29/66795 |
| | | | 257/401 |
| 2015/0318216 A1 * | 11/2015 | Cheng | H01L 21/02164 |
| | | | 438/221 |
| 2016/0035872 A1 * | 2/2016 | Loubet | H01L 29/785 |
| | | | 257/347 |
| 2016/0218192 A1 * | 7/2016 | Doris | H01L 27/0924 |
| 2016/0218215 A1 * | 7/2016 | Doris | H01L 27/0924 |

\* cited by examiner

SELECTIVE OXIDATION OF BURIED SILICON-GERMANIUM TO FORM TENSILE STRAINED SILICON FINFETS

BACKGROUND

The present invention relates to the electrical, electronic, and computer arts, and, more particularly, to methods for forming FinFETs.

Multi-gate field-effect transistors (FETs) are of considerable interest because of their superior electrostatic integrity, as well as their promise of lower supply voltages, reduced threshold voltages, and extended scalability. FinFETs are one form of such multi-gate device. In a FinFET, a narrow channel feature (i.e., fin) is raised above the substrate and passes under a gate, which effectively wraps around the fin. The gate is thereby capacitively coupled to the top as well as the sides of the fin. So structured, very little leakage current passes through channel portions of the fin when the device is in the off state. This allows the use of lower threshold voltages and higher switching speeds.

The inclusion of strained channels in modern FinFETs holds the promise of increased charge carrier mobilities and transistor device currents. Unfortunately, however, electron mobility and hole mobility benefit from different strain characteristics. The performance of an n-type FinFET is typically improved if its channel is tensily strained. In contrast, the performance of a p-type FinFET is typically improved if its channel is compressively strained. The two types of FinFETs thereby benefit from opposite strain conditions, adding complexity to any fabrication methodologies that wish to take advantage of strain characteristics.

SUMMARY

Embodiments of the invention provide highly manufacturable fabrication technologies for forming fins that are tensily strained for n-type FinFETs and compressively strained for p-type FinFETs. These FinFETs may therefore benefit from both increased electron and hole mobilities.

Aspects of the invention are directed to a method for forming an integrated circuit with an n-region including n-type FinFETs and a p-region including p-type FinFETs. Initially, a silicon-germanium (SiGe) layer consisting essentially of silicon (Si) and germanium (Ge) is formed. The SiGe layer is recessed to form a recessed SiGe layer in the n-region while leaving an intact SiGe layer in the p-region. A Si layer consisting essentially of Si is subsequently formed on the recessed SiGe layer in the n-region. The Si layer and the recessed SiGe layer in the n-region are patterned to form a Si/SiGe fin comprising a Si fin portion disposed on a recessed SiGe fin portion. The intact SiGe layer in the p-region is also patterned to form an intact SiGe fin. The recessed SiGe fin portion in the n-region is selectively oxidized utilizing an oxidation process having an oxidation rate in the recessed SiGe fin portion faster than an oxidation rate in the Si fin portion.

Additional aspects of the invention are directed to an integrated circuit formed at least in part utilizing the method set forth in the previous paragraph.

Lastly, even additional aspects of the invention are directed to an integrated circuit including n-type FinFETs in an n-region and p-type FinFETs in a p-region. The integrated circuit comprises an n-type fin in the n-region comprising a silicon fin portion disposed on an oxidized fin portion. The silicon fin portion consists essentially of silicon, and the oxidized fin portion consists essentially of silicon, germanium, and oxygen. At the same time, a p-type fin in the p-region consists essentially of silicon and germanium.

BRIEF DESCRIPTION OF THE SEVERAL VIEWS OF THE DRAWINGS

These and other features, aspects, and advantages of the present invention will become better understood with regard to the following description, appended claims, and accompanying drawings where:

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

As used herein and in the appended claims, the transitional phrase "consisting essentially of" is intended to limit the scope of a claim to the specified material(s) plus any dopants as well as what would be considered a reasonable level of contaminants by one having ordinary skill in the semiconductor arts.

Figure 1A:
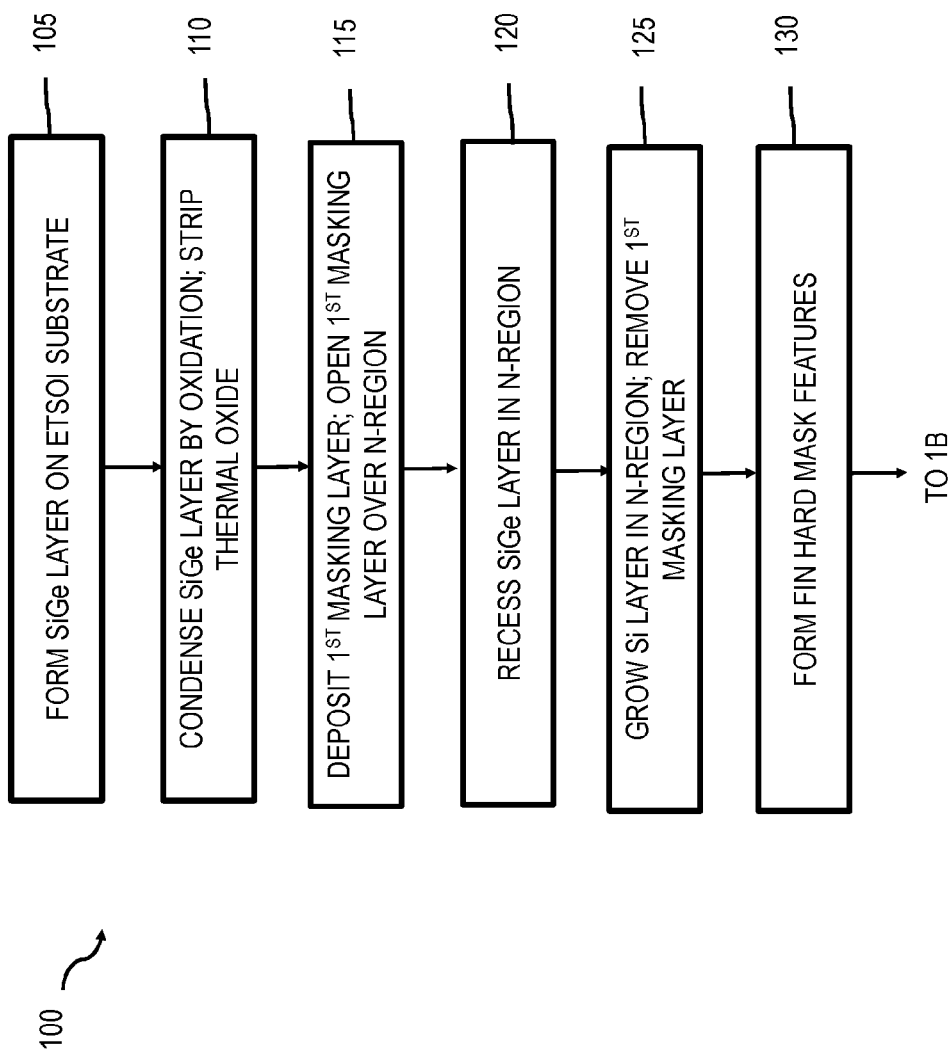
FIGS. 1A and 1B show a flow diagram of a method for forming strained fins for FinFETs, in accordance with an illustrative embodiment of the invention.
Figure 1B:
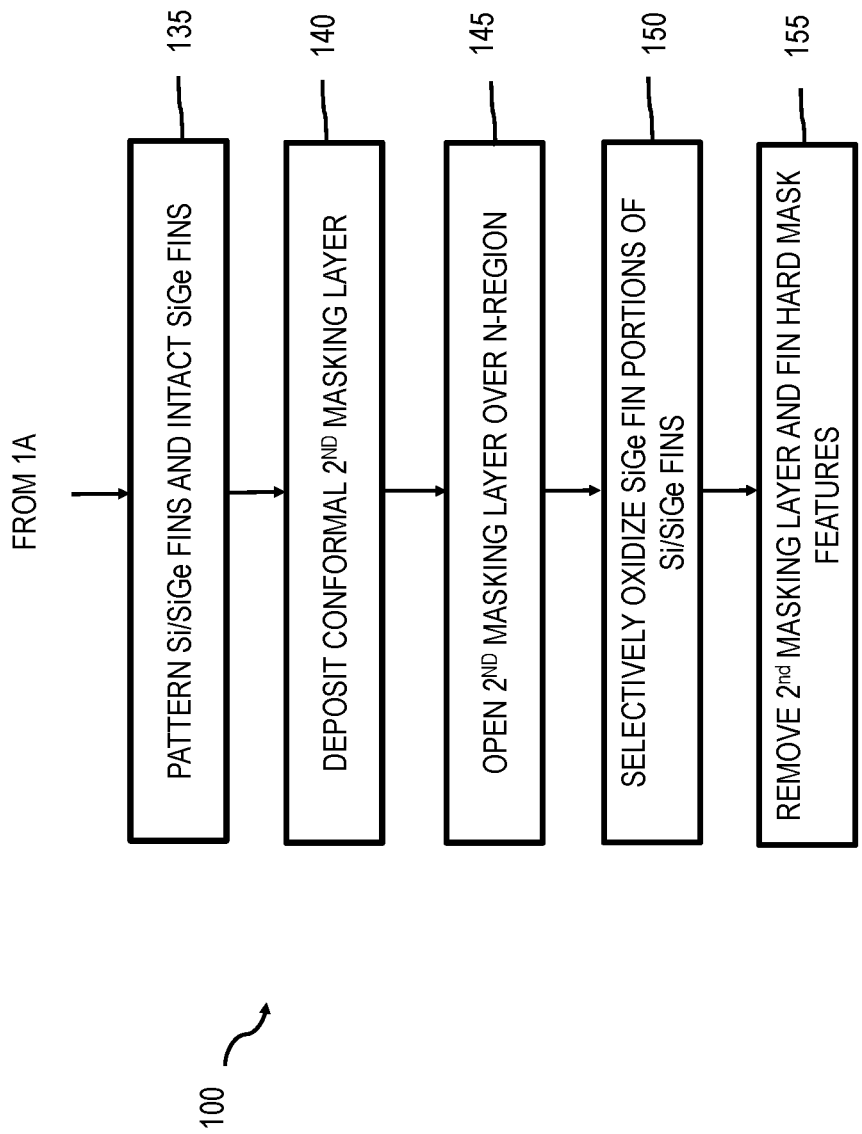

FIGS. 1A and 1B show a flow diagram of an illustrative method 100 for forming fins in FinFETs, while FIGS. 2-13 show sectional views of intermediate film stacks formed while performing the method 100. Advantageously, the method 100, and, more generally, method embodiments in accordance with aspects of the invention, provide highly manufacturable fabrication technologies for forming fins that are tensily strained for n-type FinFETs and compressively strained for p-type FinFETs. These FinFETs may therefore benefit from both increased electron and hole mobilities.

Although the method 100 and the structures formed thereby are entirely novel, many of the individual processing steps required to implement the method 100 may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, S. Wolf and R. N. Tauber, *Silicon Processing for the VLSI Era, Volume 1*, Lattice Press, 1986; S. Wolf, *Silicon Processing for the VLSI Era, Vol. 4: Deep-Submicron Process Technology*, Lattice Press, 2003; and S. M. Sze, *VLSI Technology, Second Edition*, McGraw-Hill, 1988, all of which are hereby incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However, one skilled in the art will readily recognize those processing steps omitted from this more generalized description.

At the same time, structural and functional aspects of MOSFETs and FinFETs are described in J. G. Fossum et al., *Fundamentals of Ultra-Thin-Body MOSFETs and FinFETs*, Cambridge University Press, 2013, which is also hereby incorporated by reference herein.

Figure 2:
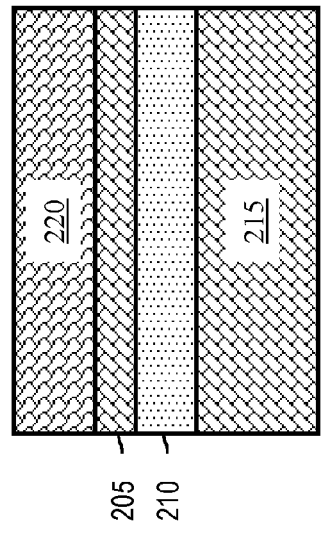
FIGS. 2 through 13 show sectional views of intermediate film stacks formed while performing the method in FIGS. 1A and 1B.

Before beginning the method 100, it is assumed that an extra-thin silicon-on-insulator (ETSOI) substrate 200 is provided with a thin silicon (Si) layer 205 disposed on a buried oxide (BOX) layer 210 (silicon dioxide), which is disposed on a crystalline Si substrate 215. This starting film stack is shown in FIG. 2. The ETSOI substrate 200 may be in the form of a wafer.

Figure 3:
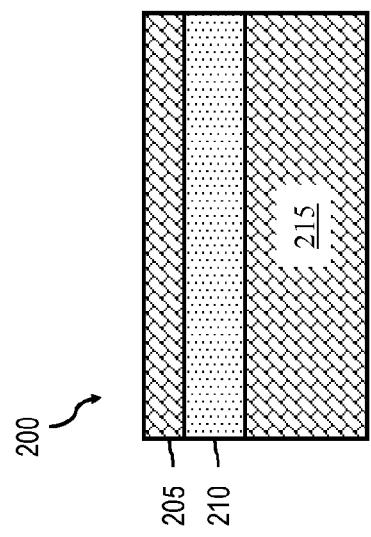

Now referring to FIGS. 1A and 1B, step 105 of the method 100 involves forming an initial silicon-germanium (SiGe) layer 220 on the ETSOI substrate 200, yielding the film stack shown in FIG. 3. The initial SiGe layer 220 may, in one or more embodiments, have a relatively low germanium (Ge) concentration (e.g., about 20 at. %) and may be strained. Deposition may be by, for example, vapor-phase epitaxy (VPE; a form of chemical vapor deposition (CVD)) in either a multi-wafer or a single-wafer reactor. When using a multi-wafer reactor, any native oxide on the surface of the thin Si layer 205 is, in one or more embodiments, initially removed by dipping the wafer in diluted hydrofluoric acid. In addition to removing the native oxide, this wet etch also acts to terminate the surface of the thin Si layer 205 in hydrogen. The wafer may then be introduced into the multi-wafer reactor, where it is exposed to silane, germane, and hydrogen in the torr total pressure range and at about 550-750° C. Single-wafer processing may be performed in a single-wafer reactor with similar processing parameters, but the wet etch to remove the native oxide may be replaced by an in-situ high temperature anneal by rapid thermal processing (RTP) to sublimate that oxide. Single-wafer reactors capable of depositing silicon-germanium are available from, for example, Applied Materials (Santa Clara, Calif., USA).

Figure 4:
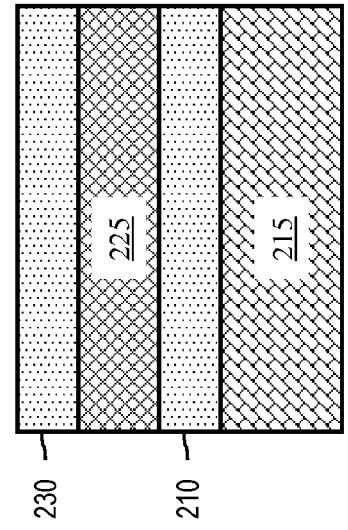

Step 110 comprises condensing the initial SiGe layer 220 to form a condensed SiGe layer 225 with a higher Ge concentration. Condensation is, in one or more embodiments, initiated by exposing the film stack in FIG. 3 to an oxygen ambient at elevated temperature (e.g., 900-1100° C.). Such an oxidation process selectively oxidizes Si atoms at the top of the initial SiGe layer 220 to form an uppermost thermal oxide layer 230 (silicon dioxide), while, at the same time, causing the diffusion of Ge through the initial SiGe layer 220 and the thin Si layer 205. This intermixing prevents Ge from piling-up at the oxidizing top interface and consequently allows Si atoms to always be provided to the advancing front of the oxidation. In addition, the BOX layer 210 and the top thermal oxide layer 230 act as diffusion barriers for Ge during the oxidation process. Ge is thereby effectively "pushed into" (i.e., condensed into) the condensed SiGe layer 225 underneath the thermal oxide layer 230. The net result of the condensation process is shown in FIG. 4. The condensed SiGe layer 225 is disposed above the BOX layer 210 and is covered by the thermal oxide layer 230. The condensed SiGe layer 225 (hereinafter just "the SiGe layer 225") may have a much higher Ge concentration than the initial SiGe layer 220 and may be strained. In one or more embodiments, for example, the Ge atomic fraction in the SiGe layer 225 may be about 30 at. %, although this percentage is merely by way of illustration. So long as the Ge concentration is not excessive (e.g., by some studies, so long as it is less than about 60 at. %), the compressive strain in the SiGe layer 225 will increase with Ge concentration. In one or more embodiments, for example, the SiGe layer 225 may have a compressive strain of about 1.2%. After this condensation by oxidation, the thermal oxide layer 230 is, in one or more embodiments, removed by conventional wet chemical etching.

Figure 5:
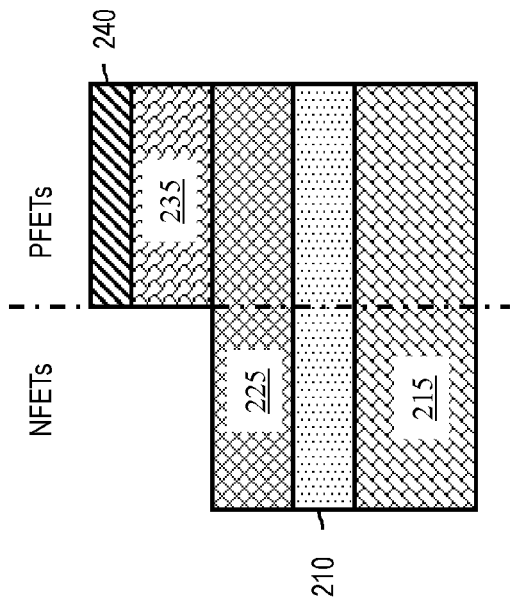

Because it is intended that, when going forward in the method 100, differing processes occur in regions of the integrated circuit intended for n-type FinFETs (n-regions) and in regions of the integrated circuit intended for p-type FinFETs (p-regions), step 115 utilizes a photolithographic process to form a first masking layer over the p-region, while leaving the n-region uncovered (i.e., open). The resultant film stack is shown in FIG. 5. In FIG. 5, a first masking layer 235 covers the p-region and is topped by a first photolithographic mask 240. Formation of the film stack in FIG. 5 may occur by depositing a layer of first masking material, and then depositing the first photolithographic mask 240 thereon. Subsequently, the first photolithographic mask 240, in one or more embodiments, is exposed and developed using conventional photolithographic techniques to pattern the first photolithographic mask 240 into the desired closed and open regions. With the patterned first photolithographic mask 240 in place, the layer of first masking material may then be anisotropically etched by, for example, reactive ion etching (RIE) to remove that layer from the n-region. In one or more embodiments, the first masking layer 235 may comprise silicon nitride.

Figure 6:
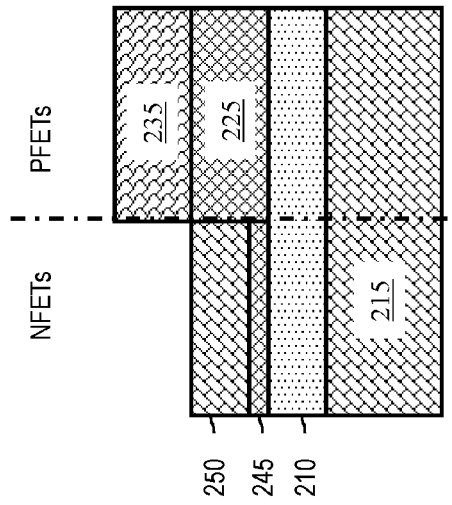

Step 120 has the SiGe layer 225 in the n-region recessed below the level of the SiGe layer 225 in the p-region to leave a recessed SiGe layer 245 in the n-region and the intact SiGe layer 225 in the p-region, as shown in FIG. 6. This recessing step may occur by RIE with the first photolithographic mask 240 and the first masking layer 235 in place. The thickness of the recessed SiGe layer 245 may, in one or more non-limiting, illustrative embodiments, be about 20% of the thickness of the intact SiGe layer 225. After the recessing, the first photolithographic mask 240, in one or more embodiments, is stripped.

Figure 7:
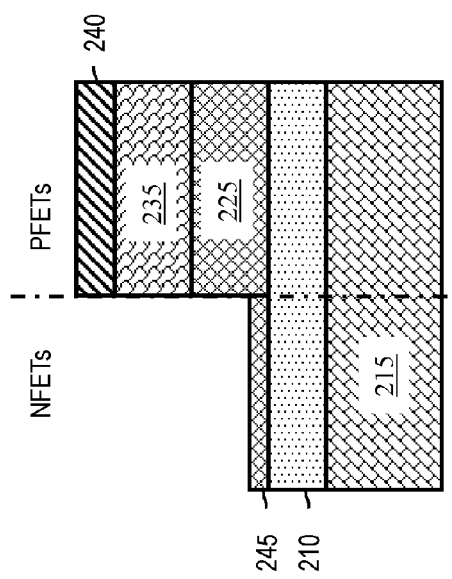
Figure 8:
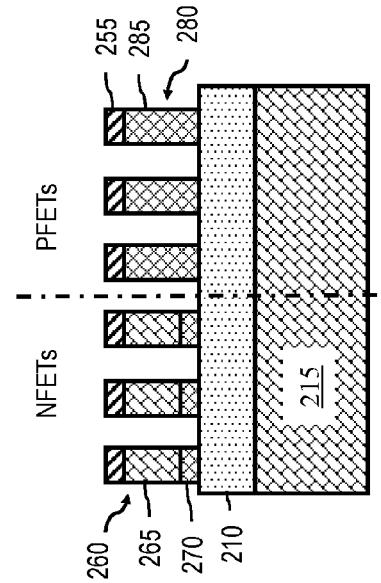
Figure 9:
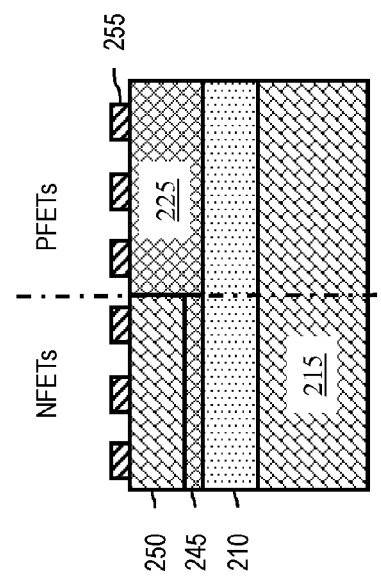

Next, step 125 involves growing a Si layer 250 on the exposed recessed SiGe layer 245 in the n-region to form the film stack in FIG. 7. Growth of the Si layer 250 is preferably conducted until its uppermost surface is about flush with the top of the intact SiGe layer 225. Epitaxial growth may again be by VPE (i.e., CVD). Such growth is preferably selective for the exposed recessed SiGe layer, meaning that little or no growth will occur on the first masking layer 235 (silicon nitride). Silane and hydrogen may be utilized as reactants in a manner similar to the VPE utilized to grow the initial SiGe layer 220 in step 105. Because of Ge is larger than Si, a lattice mismatch between the newly grown Si layer 250 and the underlying recessed SiGe layer 245 will cause the as-deposited Si layer 250 to be somewhat tensily strained. After the epitaxy, the first masking layer 235 may be etched away by an isotropic etch process such as conventional wet chemical etching.

The recessed SiGe layer 245 and the Si layer 250 in the n-region and the intact SiGe layer 225 in the p-region, in one or more embodiments, is then patterned into fins for use in FinFETs. Step 130 includes forming fin hard mask features 255 that overlie the positions were the fins are intended, yielding the film stack shown in FIG. 8. The fin hard mask features 255 may be formed of, for example, silicon nitride. Formation of the fin hard mask features 255 may be accomplished in a manner similar to the formation of the first masking layer 235, that is by depositing a layer of fin hard mask material, and then utilizing a second photolithographic mask and RIE to pattern the layer of fin hard mask material into the fin hard mask features 255. After patterning the fin hard mask features 255, the second photolithographic mask may be stripped. Alternatively, step 130 may be accomplished by a Sidewall Image Transfer (SIT) process. Such a process is described in, for example, U.S. Pat. No. 8,455,364 to S. K. Kanakasabapathy, and entitled "Sidewall image transfer using lithographic stack as the mandrel," which is hereby incorporated by reference herein. In step 135, RIE may then be used to transfer the pattern of the fin hard mask features 255 into the underlying Si layer 250, the recessed SiGe layer 245, and the intact SiGe layer 225 to yield the film stack shown in FIG. 9. In the n-region, one then finds a plurality of Si/SiGe fins 260 with each Si/SiGe fin 260 comprising a respective fin hard mask feature 255 overlying a respective Si fin portion 265, which overlies a respective recessed SiGe fin portion 270. In the p-region, one finds a plurality of SiGe fins 280, with each SiGe fin 280 comprising a respective fin hard mask feature 255 overlying a respective intact SiGe fin 285.

Figure 10:
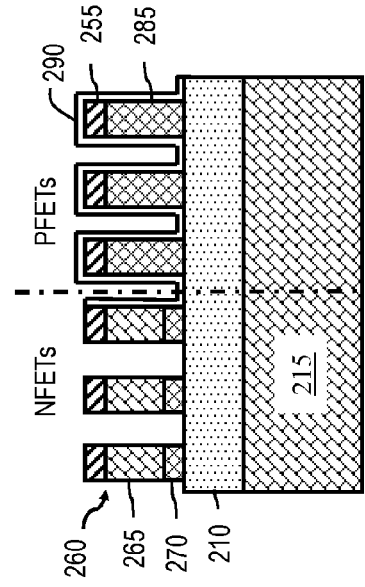
Figure 12:
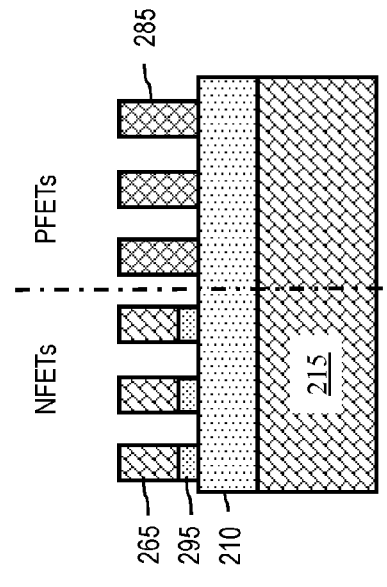
Figure 11:
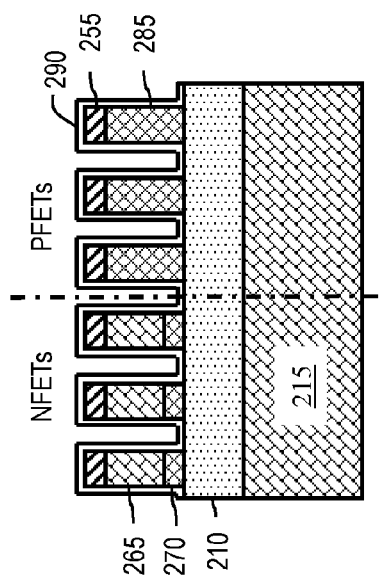

Step 140 involves the depositing of a second masking layer 290 to yield the film stack shown in FIG. 10. The second masking layer 290 is preferably conformal to the fin features, as indicated in the figure. The second masking layer 290 may, for example, comprise a thin layer of silicon nitride. The silicon nitride may be deposited by conventional CVD, which can be made to be highly conformal.

In step 150, a third photolithographic mask is used to remove the second masking layer 290 from the n-region and allow the second masking layer 290 to remain intact over the p-region. In this processing, the third photolithographic mask may be deposited, exposed, and developed such that the third photolithographic mask covers the p-region (i.e., is closed in the p-region), and is open in the n-region. Conventional RIE may then be utilized to remove the second masking layer 290 (silicon nitride) in the n-region. When the RIE processing is completed, the third photolithographic mask may be stripped to yield the film stack shown in FIG. 11.

Step 150 comprises selectively oxidizing the recessed SiGe fin portions 270 of the Si/SiGe fins 260 in the n-region. This yields the film stack shown in FIG. 12, with the recessed SiGe fin portions 270 now replaced with oxidized SiGe fin portions 295. The oxidized SiGe film portions 295 comprise silicon, germanium, and oxygen. In accordance with aspects of the invention, the oxidation process in step 150 is performed such that the oxidation rate in the recessed SiGe fin portions 270 is faster than that in the Si fin portions 265 (giving the process its selectivity). In one or more embodiments, this oxidation process may be performed by wet oxidation, that is, by exposure to steam at elevated temperature. The wet oxidation of silicon-germanium tends to be significantly faster than the oxidation of silicon.

Silicon dioxide has a different molecular density than silicon-germanium, and thus the fin portions underlying the Si fin portions 265 in the n-region will experience a volume expansion when being converted from the recessed SiGe fin portions 270 to the oxidized SiGe fin portions 295. During oxidation, the elevated temperature is preferably below the glass transition temperature of silicon dioxide to maximize this expansion. The expanded oxidized SiGe fin portions 295, in turn, stretch the overlying Si fin portions 265, inducing even more tensile strain in the Si fin portions 265. Thus, tensile strain in the Si fin portions 265 is induced twice, once during deposition in step 125, and again in the selective oxidation in step 150.

Figure 13:
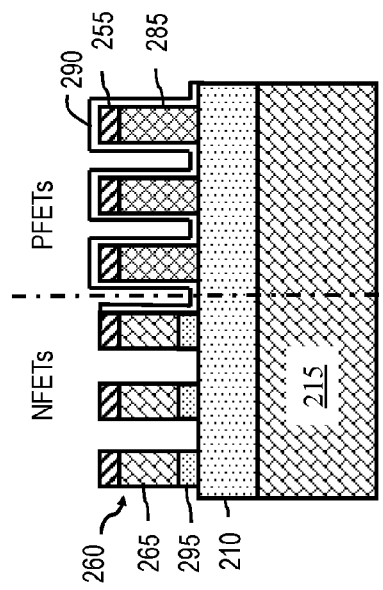

With the selective oxidation process completed, the method 100 finishes with step 155 wherein the remaining second masking layer 290 and the fin hard mask features 255 are removed. These etches may be performed by conventional wet chemical etching. The resultant film stack is shown in FIG. 13. With the fins now formed, the fins may be further processed to form the desired FinFETs.

Thus the method 100, and more generally, methods in accordance with aspects of the invention, act to form fins with Si fin portions overlying SiGe fin portions in a region of an integrated circuit intended for n-type FinFETs, and then utilize the selective oxidation of the SiGe fin portions to expand those portions and induce tensile strain in the overlying Si fin portions. Meanwhile, two masking layers patterned utilizing photolithography allow the fins in the p-region of the integrated circuit to remain as intact compressively-strained SiGe. Ultimately, the n-type FinFETs benefit from increased electron mobility, while the p-type FinFETs benefit from increased hole mobility. Processing utilizes a unique sequence of processing steps, but, individually, these processing steps are largely conventional and may be performed utilizing conventional tooling.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices, and a central processor. These integrated circuits and end products would also fall within the scope of the invention.

It should again be emphasized that the above-described embodiments of the invention are intended to be illustrative only. Other embodiments may, for example, utilize different materials and processing steps from those expressly set forth above to achieve embodiments falling within the scope of the invention. These many alternative embodiments will be apparent to one having ordinary skill in the relevant arts All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. §112(f). In particular, the use of "steps of" in the claims herein is not intended to invoke the provisions of AIA 35 U.S.C. §112(f).

What is claimed is:

1. A method for forming an integrated circuit with an n-region including n-type FinFETs and a p-region including p-type FinFETs, the method comprising the steps of:
   forming a silicon-germanium (SiGe) layer consisting essentially of silicon (Si) and germanium (Ge);
   recessing the SiGe layer to form a recessed SiGe layer in the n-region while leaving an intact SiGe layer in the p-region;

forming a Si layer consisting essentially of Si on the recessed SiGe layer in the n-region;

patterning the Si layer and the recessed SiGe layer in the n-region to form a Si/SiGe fin comprising a Si fin portion disposed on a recessed SiGe fin portion;

patterning the intact SiGe layer in the p-region to form an intact SiGe fin; and selectively oxidizing the recessed SiGe fin portion in the n-region utilizing an oxidation process having an oxidation rate in the recessed SiGe fin portion faster than an oxidation rate in the Si fin portion.

2. The method of claim 1, wherein the step of forming the SiGe layer comprises oxidizing a layer comprising silicon and germanium.

3. The method of claim 1, wherein the step of recessing the SiGe layer comprises forming a masking layer covering the p-region and open over the n-region.

4. The method of claim 3, wherein forming the masking layer comprises photolithography and reactive ion etching.

5. The method of claim 3, wherein the step of forming the Si layer is performed at least in part with the masking layer in place.

6. The method of claim 1, wherein the step of forming the Si layer comprises epitaxial growth of silicon on silicon-germanium.

7. The method of claim 1, wherein the Si layer is tensily strained immediately after formation.

8. The method of claim 1, wherein the step of selectively oxidizing the SiGe fin portion comprises forming a masking layer covering the p-region and open over the n-region.

9. The method of claim 8, wherein forming the masking layer comprises photolithography and reactive ion etching.

10. The method of claim 8, wherein the masking layer is conformal with the intact SiGe fin.

11. The method of claim 8, wherein the masking layer comprises silicon nitride.

12. The method of claim 1, wherein the step of selectively oxidizing the SiGe fin portion comprises wet oxidation.

13. The method of claim 1, wherein the step of selectively oxidizing the SiGe fin portion increases tensile strain in the Si fin portion.

14. The method of claim 1, wherein the intact SiGe fin in the p-region is compressively strained.

* * * * *